United States Patent
Shim

(10) Patent No.: US 7,154,808 B2
(45) Date of Patent: Dec. 26, 2006

(54) SEMICONDUCTOR MEMORY DEVICE FOR SIMULTANEOUSLY TESTING BLOCKS OF CELLS

(75) Inventor: Young Bo Shim, Kyungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 2 days.

(21) Appl. No.: 11/125,380

(22) Filed: May 9, 2005

(65) Prior Publication Data

US 2006/0034139 A1   Feb. 16, 2006

(30) Foreign Application Priority Data

Aug. 11, 2004   (KR) .................... 10-2004-0063057

(51) Int. Cl.
  G11C 8/00    (2006.01)
  G11C 7/00    (2006.01)
  G11C 29/00   (2006.01)
  G11C 8/12    (2006.01)
(52) U.S. Cl. .................... 365/230.04; 365/230.03; 365/201; 714/718
(58) Field of Classification Search .......... 365/230.03, 365/230.04, 201; 714/5, 718
See application file for complete search history.

(56) References Cited

U.S. PATENT DOCUMENTS 5,751,170 A    5/1998  Pyeon
6,166,967 A   12/2000  Do
6,301,170 B1 * 10/2001  Jang ..................... 365/201
6,741,510 B1 *  5/2004  Ohbayashi et al. ......... 365/201
2001/0014043 A1 8/2001  Jang

FOREIGN PATENT DOCUMENTS

JP       63-140498    6/1998
JP       2001-014895  1/2001

* cited by examiner

Primary Examiner—Amir Zarabian
Assistant Examiner—Michael Weinberg
(74) Attorney, Agent, or Firm—Marshall, Gerstein & Borun LLP

(57) ABSTRACT

A semiconductor memory device comprises a plurality of cell blocks, block controllers for activating or precharging word lines of each of the cell blocks according to an external active command and a precharge command, a sense amplifier for sensing a fine voltage shared by bit lines and complementary bit lines of the cell blocks, sense amplifier controllers for activating or precharging the sense amplifier according to the external active command and the precharge command, and outputting bit line isolation signals that control the connection between the sense amplifier and the cell block, a block address decoder for decoding external block addresses in normal mode to output a block select signal for selecting one cell block, and outputting a block select signal for selecting even or odd cell blocks according to one of the external block addresses in test mode, and a SES control block for outputting a bit line isolation control signal for controlling the bit line isolation signals and a sense amplifier enable signal according to a test mode signal, a bank active signal and a sense enable start signal.

11 Claims, 6 Drawing Sheets

SEMICONDUCTOR MEMORY DEVICE FOR SIMULTANEOUSLY TESTING BLOCKS OF CELLS

BACKGROUND

1. Technical Field

A semiconductor memory device is disclosed in which defective cells caused due to a minute leakage current on bit lines and complementary bit lines can be screened.

2. Discussion of Related Art

In semiconductor memory devices such as DRAMs, defects are generated in cells of a memory block due to a minute leakage current on unspecific bit lines and complementary bit lines due to process defects. Accordingly, these defects need to be screened. A time of several hundred microsecond to several millisecond is needed per one word line in order to screen these defects.

In the prior art, by activating one word line at a time, memory cells of all word lines are sequentially tested. Therefore, a significantly large amount of time is consumed to screen for weak cells. This causes the production costs to increase.

SUMMARY OF THE DISCLOSURE

Accordingly, in view of the above problems, a semiconductor memory device in which respective word lines of all even or odd cell blocks are activated at the same time, and an operating time point of a sense amplifier allocated to each cell block is arbitrarily controlled, thereby significantly reducing the test time needed to screen for weak cells.

A disclosed semiconductor memory device comprises: a plurality of cell blocks, block controllers for activating or precharging word lines of each of the cell blocks according to an external active command and a precharge command, a sense amplifier for sensing a fine voltage shared by bit lines and complementary bit lines of the cell blocks, sense amplifier controllers for activating or precharging the sense amplifier according to the external active command and the precharge command, and outputting bit line isolation signals that control the connection between the sense amplifier and the cell block, a block address decoder for decoding external block addresses in normal mode to output a block select signal for selecting one cell block, and outputting a block select signal for selecting even or odd cell blocks according to one of the external block addresses in test mode, and a control block for outputting a bit line isolation control signal for controlling the bit line isolation signals and a sense amplifier enable signal according to a test mode signal, a bank active signal and a sense enable start signal.

If an active operation command is executed in particular test mode without affecting a normal operation in order to reduce the production cost, respective word lines are activated in all even or odd cell blocks. Even a sensing operation of a sense amplifier allocated to the even or odd cell blocks can be controlled according to an external command.

DETAILED DESCRIPTION OF PRESENTLY PREFERRED EMBODIMENTS

Figure 1:
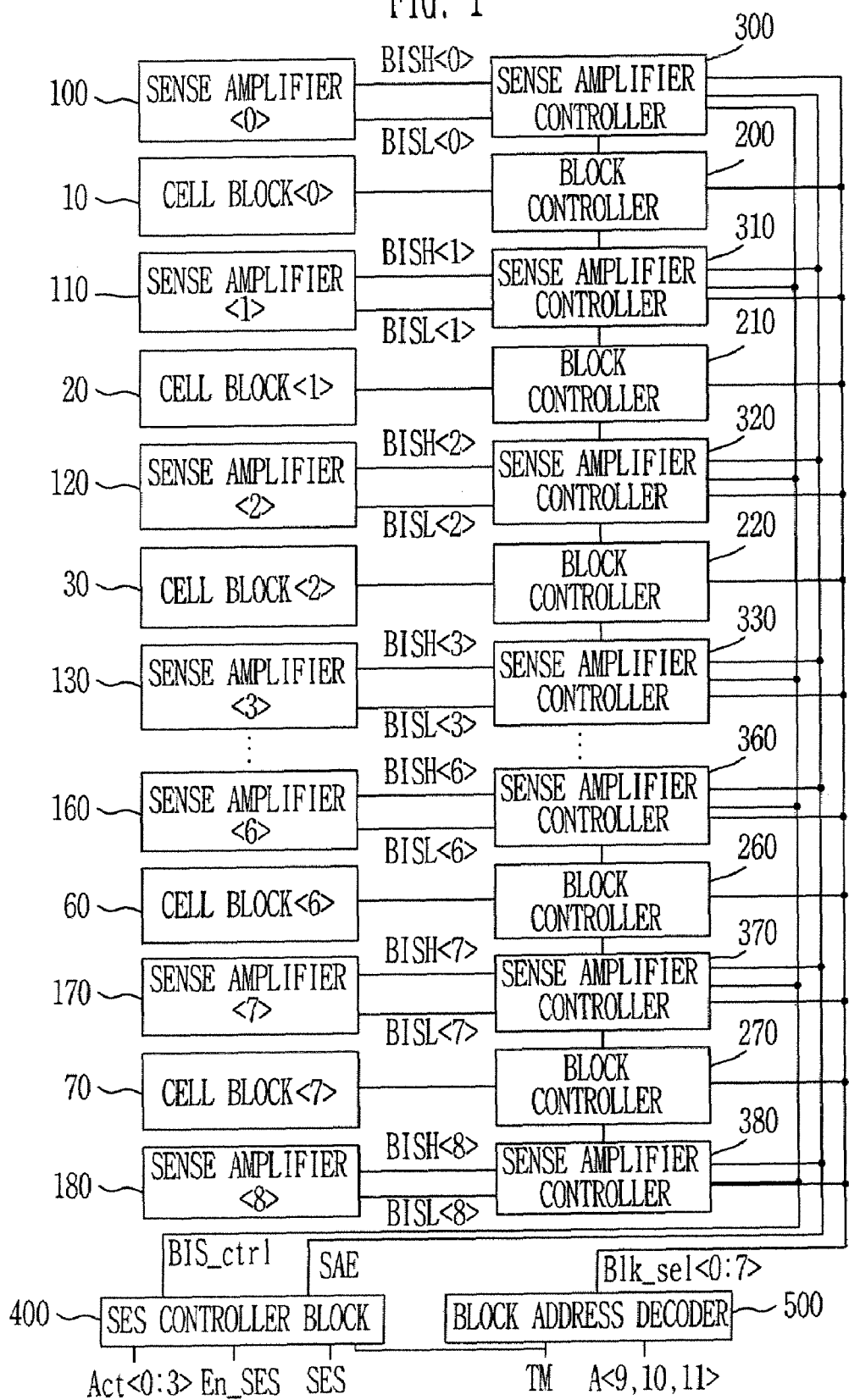
FIG. 1 is a disclosed block diagram illustrating the configuration of a semiconductor memory device.

FIG. 1 is a block diagram illustrating the configuration of a disclosed semiconductor memory device.

A memory consisting of four banks will be described as an example. The memory includes eight cell blocks. Further, sense amplifiers 100 to 180 the number of which is greater by one than the number of the cell blocks, are provided. Each of the sense amplifiers 100 to 180 is controlled according to the output of each of sense amplifier controllers 300 to 380. Each of the cell blocks is controlled according to the output of each of the block controllers. A SES control block 400 is a block that controls a signal SES (Sense Enable Start). A block address decoder 500 serves to decode an external block address that controls the cell blocks.

Signals Act<0:3> are pulse signals, which are generated when a bank active command is input externally. The memory consisting of the four banks will be described as an example. A signal En_SES is a signal to enable the signal SES and is generated when an external BST (it can be arbitrarily changed) command is input. The signal SES is a level signal generated by the bank active command. A signal TM is an abbreviation of a test mode. This signal is a signal that is inserted in order to implement a specific test upon development or production of a memory not the normal operation. Addresses A<9, 10, 11> are used to select the cell blocks and are input from external pins before decoding. Since the disclosed memory has the eight cell blocks, a 3-bit address is required. A signal BIS_ctrl is a bit line isolation control signal and serves to control BISH or BISL signals. If the signal TM is at a logic LOW level, the signal BIS_ctrl always keeps a HIGH level. If the signal TM is at a logic HIGH level, the signal BIS_ctrl is controlled by the signal En_SES and the signals ACT<0:3>. A signal SAE (Sense Amplifiers Enable) is a signal to control the sense amplifier. If the signal TM is at a logic LOW level, the signal SAE is outputted by delaying and then buffering the signal SES. If the signal TM is at a logic HIGH level, the signal SAE is controlled by the signals SES, En_SES and Act<0:3>. Signals Blk_sel<0:7> is an abbreviation of block selection and is a b lock s election address, which is decoded from the addresses A<9, 10, 11>. At this time, if the signal TM is at a logic LOW level, the signals Blk_sel<0:7> are dependent upon decoding of the addresses A<9, 10, 11> by means of the normal operation. However, if the signal TM is at a logic HIGH level, the signals Blk_sel<0:7> are controlled according to the addresses A<9> (The addresses A<10,11> is don't care).

The signals BISH (Bit Line Isolation High) <0:8> are a signal, which controls pass transistors (Q7 and Q8 in FIG. 5) at the top of the sense amplifier, which are connected to the cell block through a combination of the signals Blk_sel<0:7>and the signal BIS_ctrl. The signals BISL (Bit Line Isolation Low) <0:8> are a signal, which controls pass transistors (Q16 and Q17 in FIG. 5) at the bottom of the sense amplifier, which are connected to the cell block through a combination of the signals Blk_sel<0:7> and the signal BIS_ctrl.

A cell block <0> to a cell block <7> 10 to 70 are eight cell array blocks in which memory cells are respectively arranged. At this time, since each array is composed of 512 word lines per one cell block, a necessary address is 9 bits, i.e., addresses A<0:8>.

Figure 5:
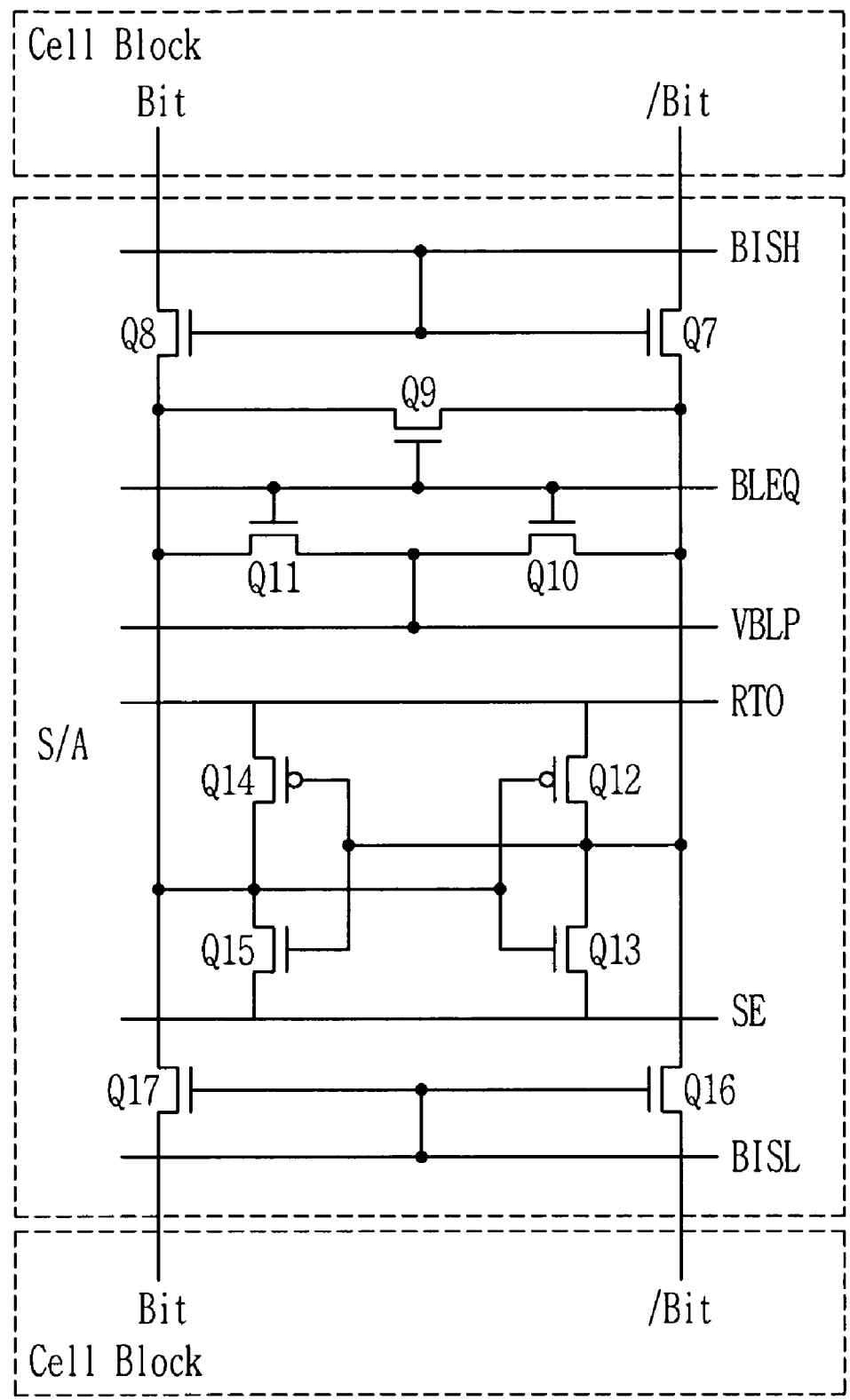
FIG. 5 is a detailed circuit diagram illustrating the configuration of a bit line sense amplifiers shown in FIG. 1.

Each of the sense amplifier <0> to the sense amplifier <8> 100 to 180 has the configuration as shown in FIG. 5. If the word line is activated, a fine voltage is loaded onto the bit lines by means of a charge sharing operation between the cell and the bit line due to the amount of charge stored in the cell. At this time, the sense amplifier serves to sense and amplify the fine voltage and then restore the amplified voltage to the cell.

The sense amplifier controllers 300 to 380 serve to control the sense amplifiers, respectively. The sense amplifier controllers activate or precharge the sense amplifiers according to an external active and precharge command. Furthermore, the sense amplifier controllers output the signals BISH or BISL for controlling the top and bottom pass transistors that connect the sense amplifiers and the cell blocks.

Block controllers 200 to 270 serve to control the word lines of the cell blocks 10 to 70, respectively. The block controllers 200 to 270 activate or precharge the word lines according to the external active and precharge command.

The SES control block 400 serves to outputs of control the signal BIS ctrl and the signal SAE. The SES control block 400 keeps the signal BIS_ctrl at a logic HIGH level in normal operation mode if the signal TM is at a logic LOW level, but passes through the signal SES intact and then outputs the signal SAE. If the signal TM is at a logic HIGH level, however, the SES control block 400 enters a test mode. At this time, if the bank active signals Act<0:3> is input as a HIGH pulse, a node a in a detailed circuit diagram of the SES control block shown in FIG. 3 shifts from a HIGH level to a LOW level, and the signal BIS_ctrl and the signal SAE thus become a LOW level. At this time, although the signal SES shifts from a LOW level to a HIGH level, it does not affect the signal SAE. Thereafter, if the signal En_SES is input as a HIGH pulse, the node a shifts from the LOW level to the HIGH level. Thus, the signal BIS_ctrl is output as a HIGH level and the signal SAE is controlled according to the signal SES.

The block address decoder 500 serves to decode an external address that controls the cell blocks. If the signal TM is at a logic LOW level, the block address decoder 500 enters a normal operation mode, and receives and decodes input signals A<9:11>, thereby making one of the eight block signals Blk<0:7> have a logic HIGH level and the remaining seven block signals having a LOW level. If the signal TM becomes a HIGH level, the block address decoder 500 enters a test mode, so that the output of the block address decoder 500 is dependent upon only by the input signal A<9>. If the input signal A<9> becomes a LOW level, the output signals Blk<0, 2, 4, 6> become a HIGH level, and the output signals Blk<1, 3, 5, 7> become a LOW level. If the input signal A<9> is at a logic HIGH level, the output signals Blk<0, 2 4, 6> become a LOW level, and the output signals Blk<1, 3, 5, 7 become a HIGH level.

Figure 7:
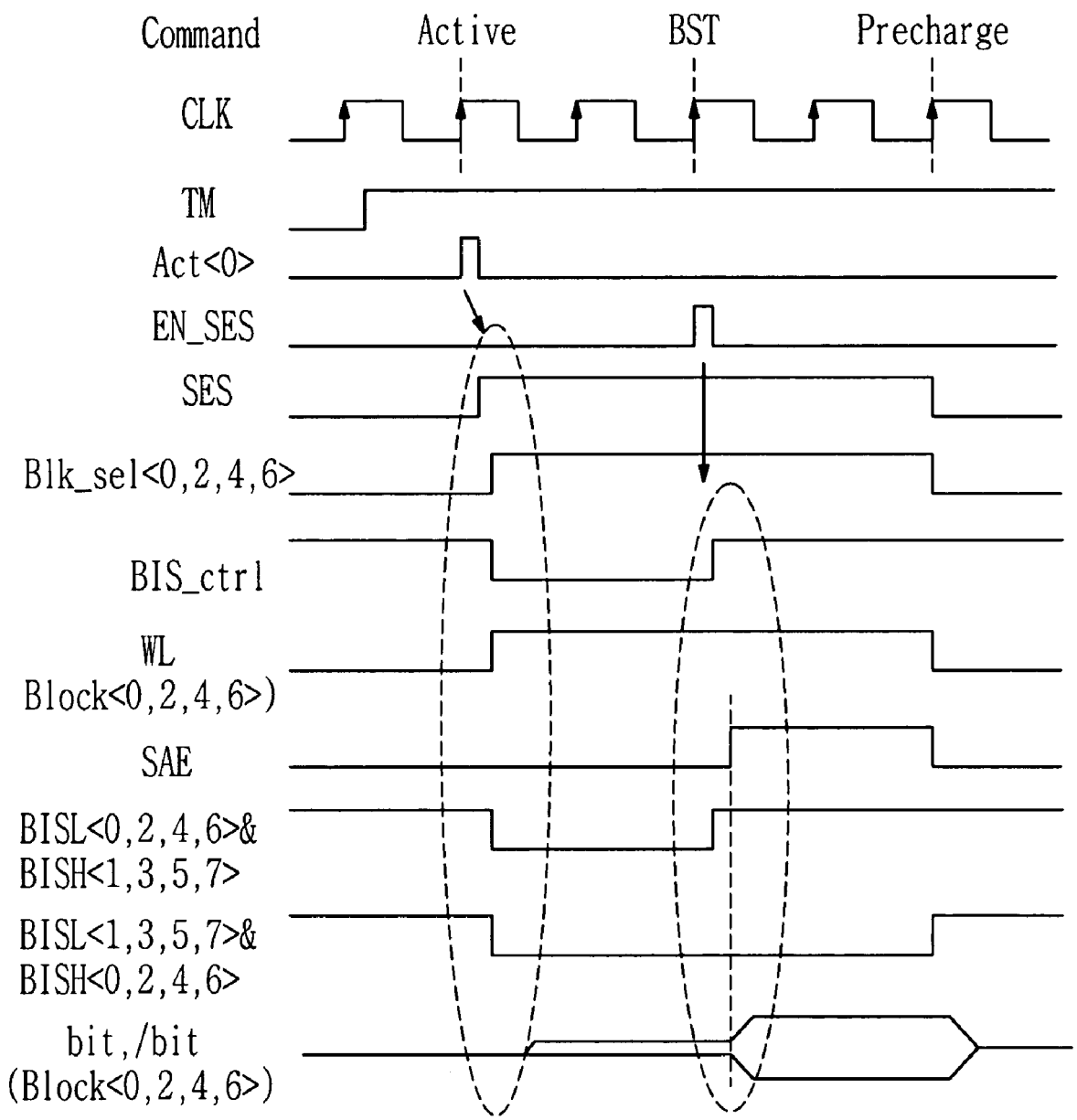
FIG. 7 is a timing diagram for explaining a sensing operation in multi-block active and sense amplifiers control mode.

It is assumed that one cell array block is composed of 512 word lines in the memory consisting of the eight cell blocks per bank. In this case, in order to construct the 512 word lines of the one cell block, the nine addresses A<0:8> are needed. In order to construct the eight cell blocks, the three addresses A<9:11> are necessary. The overall operation will now be described with referenced to a timing diagram of FIG. 7.

A method of activating, sensing and precharing even-numbered cell blocks will be first described.

1) Active Command

With the signal TM being set to a HIGH level, if an active command Active is input externally together with addresses A<0:9>=low, A<10, 11 >=don't care, the signal Act of a HIGH pulse is generated. Then, as the signal BIS_ctrl shifts from a HIGH level to a LOW level, both the signals BISH<0:8> and signals BISL<0:8> are changed from a HIGH-level being a precharge state to a LOW level. Thus, pass transistors to which all cell blocks and a sense amplifier are connected are disabled. Next, if the signals Blk_sel<0, 2, 4, 6> shift from a LOW level to a HIGH level, word lines having an address of "0" (dependent upon A<0:8>) in each of even-numbered cell block are activated. Thus, a fine voltage is loaded onto bit lines (or complementary bit lines).

2) BST Command

If a BST (Burst Stop, which can be arbitrarily changed) command is input externally, the signal En_SES of a HIGH level is generated. Accordingly, the signal BIS_ctrl shifts from a LOW level to a HIGH level. Thus, the signals BISL:<0, 2, 4, 6> being gate signals of connection transistors between the cell blocks and the sense amplifier shift from a LOW level to a HIGH level, so that the fine voltage on the bit lines (or complementary bit lines), which share charges, are introduced into the sense amplifier. Furthermore, since the signal SAE shifts from a LOW level to a HIGH level and the sense amplifier is thus activated, the fine voltage on the bit lines (or complementary bit lines) are amplified and then restored to cells.

3) Precharge Command

If a precharge command Precharge is input externally, word lines that have been activated previously shift from a HIGH level to a LOW level. Thereafter, the signal SES shifts from a HIGH level to a LOW level. For this reason, the signal SAE shifts from a HIGH level to a LOW level. Further, the signals BISH<0, 2, 4, 6> shift from a LOW level to a HIGH level, thus precharging the sense amplifier and the bit lines (or complementary bit lines) with a VBLP level (bit line precharge level).

A method of activating, sensing and precharging odd-numbered cell blocks will be below described.

4) Active Command

If an active command Active is input externally together with the addresses A<0:8>=low, A<9>=high, A<10, 11>=don't care, the signal Act of a HIGH pulse is generated. Then, as the signal BIS_ctrl shifts from a HIGH level to a LOW level, both the signals BISH<0:8> and signals BISL<0:8> shift from a HIGH level being a precharge state to a LOW level. Pass transistors having all cell blocks and a sense amplifier connected thereto are thus disabled. Next, as the signals Blk_sel<1, 3, 5, 7> shift from a LOW level to a HIGH level, word lines having an address of "0" (dependent upon A<0:8>) in each of odd-numbered cell blocks are activated. Therefore, a fine voltage whose charge is shared together with cells is loaded onto bit lines (or complementary bit lines).

5) BST Command

If a BST (Burst Stop, which can be arbitrarily changed) command is input externally, the signal En_SES of a HIGH level is generated. Therefore, the signal BIS_ctrl shifts from a LOW level to a HIGH level. The signals BISL<1, 3, 5, 7> being gate signals of connection transistors between the cell blocks and the sense amplifier shift from a LOW level to a HIGH level by means of a combination with the signals Blk_sel<1, 3, 5, 7> being a HIGH level. Thus, a fine voltage on the bit lines (or complementary bit lines), which share charges, are thus introduced into the sense amplifier. Furthermore, since the signal SAE shifts from a LOW level to a HIGH level and the sense amplifier is thus activated, the fine voltage on the bit lines (or complementary bit lines) are amplified and then restored to cells.

6) Precharge Command

If a precharge command Precharge is input externally, word lines that have been activated previously shift from a HIGH level to a LOW level. Thereafter, the signal SES shifts from a HIGH level to a LOW level. For this reason, the signal SAE shifts from a HIGH level to a LOW level. Further, the signals BISH<1, 3, 5, 7> shift from a LOW level to a HIGH level, thus precharging the sense amplifier and the bit lines (or complementary bit lines) with a VBLP level (bit line precharge level).

If the ten addresses A<0:9> are combined through the above method of activating, sensing and precharging, the cells, which have been activated, sensed and precharged with conventional address bits <0: 11> can be all controlled.

Figure 6:
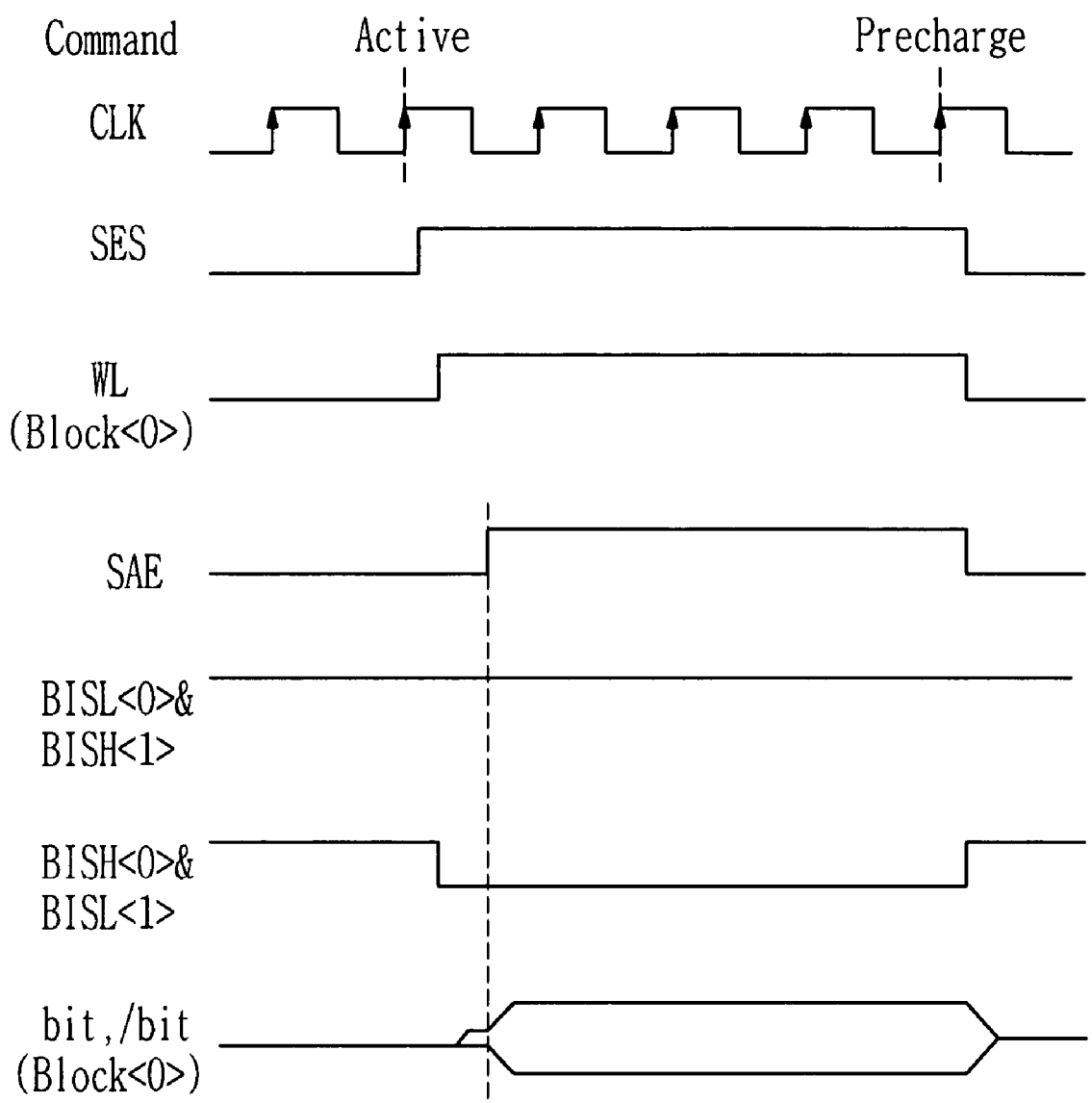
FIG. 6 is a timing diagram for explaining a sensing operation in normal mode.

FIG. 6 is a timing diagram for explaining a sensing operation in normal mode.

If the active command Active is input, the signal SES shifts from a LOW level to a HIGH level and a word line WL is enabled. The signal SAE is enabled to a logic HIGH state and the signals BISL<0> and BISH<1> keep a HIGH level, whereas the signals BISH<0> and BISL<1> shift from a HIGH level to a LOW level. For this reason, sensing of a bit line and a complementary bit line Bit and /Bit can begin from a time point where the sense amplifier enable signal SAE is enabled.

Figure 2:
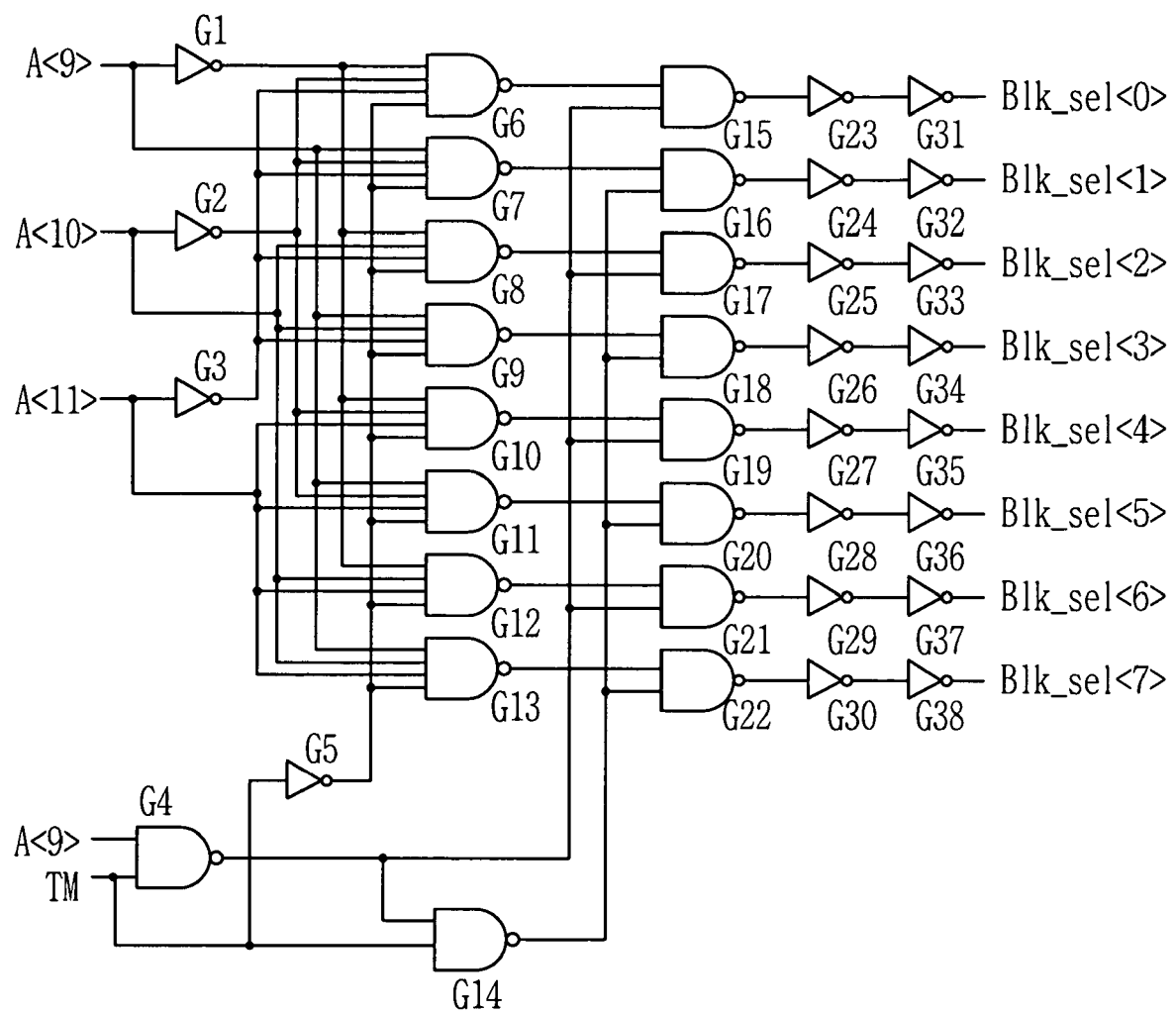
FIG. 2 is a detailed circuit diagram illustrating the configuration of a block address decoder shown in FIG. 1.

FIG. 2 is a detailed circuit diagram illustrating the configuration of the block address decoder 500 shown in FIG. 1.

An operation of activating even or odd cell blocks at the same time will be described with reference to FIG. 2.

The configuration of FIG. 2 will be first described.

An address A<9> is input directly to NAND gates G7, G9, G11 and G13 while being input to NAND gates G6, G8, G10 and G12 through an inverter G1. An address A<10> is input directly to the NAND gates G8, G9, G12 and G13 while being input to the NAND gates G6, G7, G10 and G11 through an inverter G2. An address A<11> is input directly to the NAND gate G10 while being input to the NAND gates G6, G7, G8 and G9 through an inverter G3.

The address A<9> and a signal TM are input to a NAND gate G4. The signal TM is input to the NAND gates G6 to G13. An inverted output of the NAND gate G4 and the signal TM are input to a NAND gate G14. The outputs of the NAND gates G6 to G13 are input to NAND gates G15 to G22, respectively. The output of the NAND gate G4 is input to the NAND gates G15, G17, G19 and G21. The output of the NAND gate G14 is input to the NAND gates G16, G18, G20 and G22. The output of the NAND gate G15 is input to an inverter G31 via an inverter G23. The output of the inverter G31 becomes a block select signal Blk_sel<0>. The output of the NAND gate G16 is input to an inverter G32 via an inverter G24. The output of the inverter G32 becomes a block select signal Blk_sel<1>. The output of the NAND gate G17 is input to an inverter G33 via an inverter G25. The output of the inverter G33 becomes a block select signal Blk_sel<2>. The output of the NAND gate G18 is input to an inverter G34 via an inverter G26. The output of the inverter G34 becomes a block select signal Blk_sel<3>. The output of the NAND gate G19 is input to an inverter G35 via an inverter G27. The output of the inverter G35 becomes a block select signal Blk_sel<4>. The output of the NAND gate G20 is input to an inverter G36 via an inverter G28. The output of the inverter G36 becomes a block select signal Blk_sel<5>. The output of the NAND gate G21 is input to an inverter G37 via an inverter G29. The output of the inverter G37 becomes a block select signal Blk_sel<6>. The output of the NAND gate G22 is input to an inverter G38 via an inverter G30. The output of the inverter G38 becomes a block select signal Blk_sel<7>.

If the address A<9> and the signal TM are at a logic HIGH level, the outputs of the NAND gates G6 to G13 all become a HIGH level. Further, since the output of the NAND gate G4 is a LOW level, only the outputs of the NAND gates G15, G17, G19 and G21 become a HIGH level. Thus, only the block select signals Blk_sel<0>, Blk_sel<2>, Blk_sel<4> and Blk_sel<6> become a HIGH level, and even-numbered cell blocks are thus selected.

If the address A<9> is a LOW level and the signal TM is a HIGH level, the outputs of the NAND gates G6 to G13 all become a HIGH level. Since the output of the NAND gate G14 is a LOW level, only the outputs of the NAND gates G16, G18, G20 and G22 become a HIGH level, only the block select signals Blk_sel<1>, Blk_sel<3>, Blk_sel<5> and Blk_sel<7> become a HIGH level, and odd-numbered cell blocks are thus selected.

Figure 3:
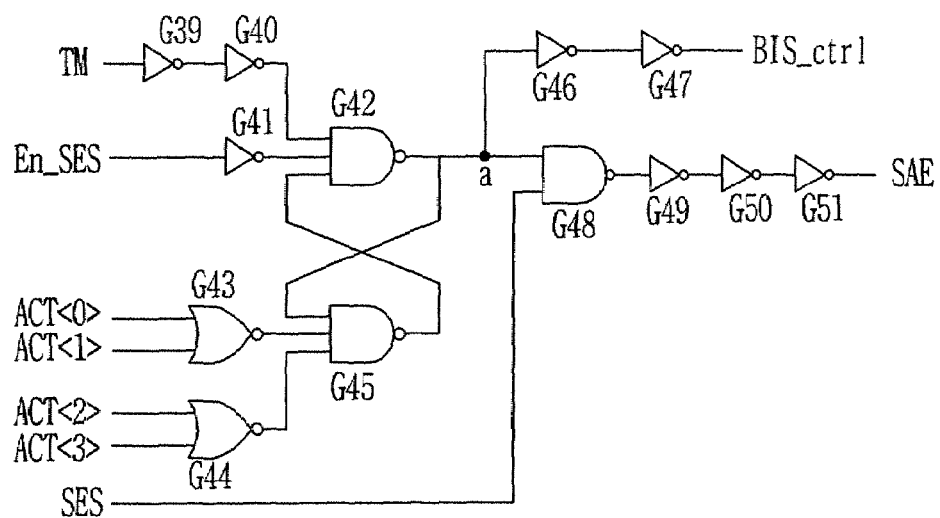
FIG. 3 is a detailed circuit diagram illustrating the configuration of a SES control block shown in FIG. 1.

FIG. 3 is a detailed circuit diagram illustrating the configuration of the SES control block 400 shown in FIG. 1.

If a signal TM is a LOW level, the output of an inverter G39 becomes a HIGH level and the output of an inverter G40 becomes a LOW level, as normal mode. Therefore, a node a being the output of a NAND gate G42 is set to a HIGH level. The output of an inverter G46 becomes a LOW level and the output of an inverter G47 becomes a HIGH level. Accordingly, a signal BIS_ctrl keeps a HIGH level. A NAND gate G48 inverts a signal SES. The output of the NAND gate G48 is again inverted by the inverters G48 to G51. Thus, if the signal TM is a LOW level, the level of the signal SES becomes the same as that of a signal SAE.

If the signal TM becomes a HIGH level, however, the SES control block 400 enters a test mode.

If the signal TM is a HIGH level, the output of the inverter G40 becomes a HIGH level. If signals ACT<0:3> are input as a HIGH pulse, the outputs of NOR gates G43 and G44 become a logic LOW state. If the signal En_SES is at a logic LOW state, the output of an inverter G41 is at a logic LOW state. Therefore, the node a being the output of the NAND gate G42 becomes a LOW level. The signals BIS_ctrl and SAE thus become a LOW level. At this time, although the signal SES shifts from a LOW level to a HIGH level, it does not affect the signal SAE. Thereafter, if the signal En_SES is input as a HIGH pulse, the node a shifts from a LOW level to a HIGH level. The signal BIS_ctrl becomes a HIGH level and the signal SAE is controlled according to the signal SES.

Figure 4:
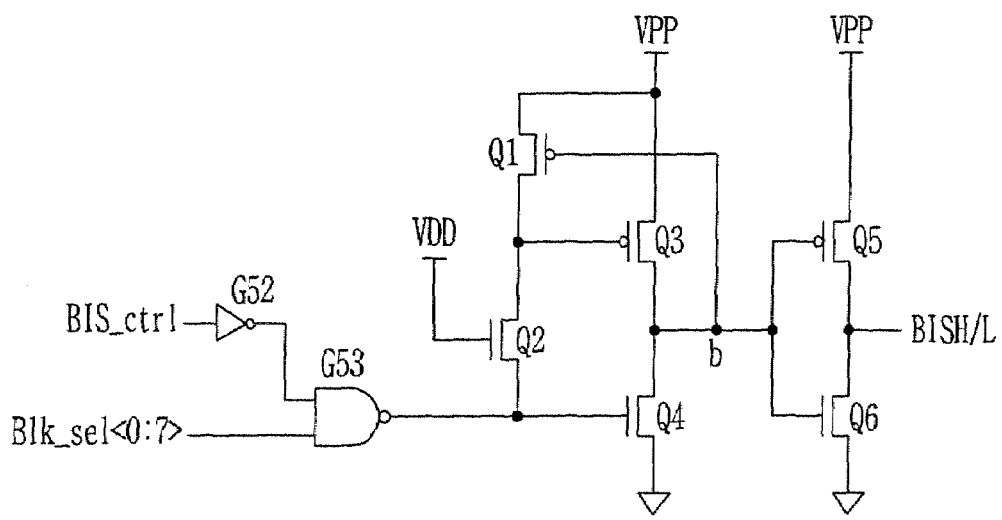
FIG. 4 is a detailed circuit diagram illustrating some of a sense amplifier controllers shown in FIG. 1.

FIG. 4 is a detailed circuit diagram illustrating some of the sense amplifier controllers shown in FIG. 1.

Transistors Q1, Q2, Q3 and Q4 constitute a level decision circuit.

If signals Blk_sel<0, 2, 4, 6, 8> or signals Blk_sel<1, 3, 5, 7> are a HIGH level and a signal BIS_ctrl is a LOW level, the output of an inverter G52 is a HIGH level, and the output of a NAND gate G53 becomes a LOW level. Therefore, the transistors Q2 and Q3 are turned on and a node b thus becomes a HIGH level. Since a transistor Q6 is turned on according to an electric potential of the HIGH level of the node b, outputs BISH/BISL become a LOW level.

If the signals Blk_sel<0, 2, 4, 6, 8> or the signals Blk_sel<1, 3, 5, 7> are a HIGH level and the signal BIS_ctrl is a HIGH level, the output of the inverter G52 is a LOW level and the output of the NAND gate G53 thus becomes a HIGH level. Therefore, the transistor Q4 is turned on and the node b become a LOW level. Since the transistor Q5 is turned on according to an electric potential of the LOW level of the node b, the output BISH/BISL becomes a HIGH level. The pass transistors Q7, Q8, Q16 and Q17 of FIG. 5 are controlled according to the output BISH/BISL.

FIG. 5 is a detailed circuit diagram illustrating the configuration of the bit line sense amplifiers shown in FIG. 1.

If a bit line equalization signal BLEQ is a HIGH level, transistors Q9, Q10 and Q11 are turned on, and the bit line and the complementary bit line Bit and /Bit become VBLP (VCORE/2).

Since the pass transistors Q7 and Q8 are turned on according to the output BISH of the sense amplifier controllers of FIG. 4, the cell block is connected to the bit line Bit and the complementary bit line/Bit. Further, since the pass transistors Q16 and Q17 are turned on according to the output BISL of the sense amplifier controller of FIG. 4, the cell block is connected to the bit line Bit and the complementary bit line/Bit.

For example, if an electric potential of the bit line Bit becomes VBLP/2+α, which is higher than an electric potential of the complementary bit line/Bit, a transistor Q13 is turned on and the complementary bit line/bit drops to a low voltage SE. Furthermore, a transistor Q14 is turned on by means of the turn-on operation of the transistor Q13, and the complementary bit line Bit thus rises to a high voltage RTO.

On the contrary, if an electric potential of the complementary bit line/Bit becomes VBLP/2+α, which is higher than an electric potential of the bit line Bit, the transistor Q13 is turned on, and the complementary bit line/Bit drops to the low voltage SE. Accordingly, the transistor Q14 is turned on by means of the turn-on operation of the transistor Q13, and the bit line Bit thus rises to the high voltage RTO.

As described above, according to the present invention, respective word lines of all even (or odd) cell blocks are activated at the same time, and an operating time point of a sense amplifier allocated to each cell block is arbitrarily controlled. Thus, a time taken to find defect cells caused due to a minute leakage current on bit lines and complementary bit lines can be reduced. The disclosed device can reduce a test time by 50% when the total of cell blocks is 4, by 25% when the total of cell blocks is 8 and by 12.5% when the total of cell blocks is 16, compared with the prior art. In other words, there is an advantage in that the test time is not increased although the number of the cell blocks is increased.

Although the foregoing description has been made with reference to the preferred embodiments, it is to be understood that changes and modifications may be made by one of ordinary skilled in the art without departing from the spirit and scope of this disclosure and the appended claims.

What is claimed is:

1. A semiconductor memory device comprising: a plurality of cell blocks; block controllers for activating or precharging word lines of each of the cell blocks according to an external active command and a precharge command;
a sense amplifier for sensing a fine voltage shared by bit lines and complementary bit lines of the cell blocks;
sense amplifier controllers for activating or precharging the sense amplifier according to the external active command and the precharge command, and outputting a bit line isolation signal that controls the connection between the sense amplifier and the cell block;
a block address decoder for decoding external block addresses in normal mode to output a block select signal for selecting one cell block, and outputting a block select signal for selecting even or odd cell blocks according to one of the external block addresses in test mode; and
a control block for outputting a bit line isolation control signal for controlling the bit line isolation signal and a sense amplifier enable signal according to a test mode signal, a bank active signal and a sense enable start signal.

2. The semiconductor memory device as claimed in claim 1, wherein the control block enters a normal mode if the test mode signal is a LOW level, thus keeping the bit line isolation signal at a HIGH level, but enters a test mode if the test mode signal is a HIGH level, thus controlling the bit line isolation signal and the sense amplifier enable signal according to the bank active signal and the sense enable start signal.

3. The semiconductor memory device as claimed in claim 1, wherein the control block comprises:
a first inverter for inverting the test mode signal;
a second inverter for inverting an output of the first inverter;
a third inverter for inverting the sense enable start signal;
a first NOR gate for combining first and second bank active signals;
a second NOR gate for combining third and fourth bank active signals;
a latch for generating a logic signal according to an output of the second inverter, an output of the third inverter, an output of the first NOR gate and an output of the second NOR gate, and latching the logic signal;
a fourth inverter for inverting an output of the latch;
a fifth inverter for inverting the output of the fourth inverter and generating the bit line isolation signal;
a NAND gate for inverting the sense enable start signal according to the output of the latch; and
odd-numbered inverters for inverting an output of the NAND gate.

4. The semiconductor memory device as claimed in claim 1, wherein the sense amplifier controllers comprise a bit line isolation signal control circuit for generating the bit line isolation signal according to the bit line isolation control signal and the block select signal.

5. The semiconductor memory device as claimed in claim 4, wherein the bit line isolation signal control circuit comprises:
an inverter for inverting the bit line isolation control signal;
a NAND gate for receiving an output of the inverter and the block select signal;
a level decision circuit for changing an electric potential of a first node to a ground level or a VPP level according to an output of the NAND gate; and
an output circuit for generating a bit line isolation signal of a HIGH level or an isolation signal of a LOW level according to the electric potential of the first node.

6. The semiconductor memory device as claimed in claim 5, wherein the level decision circuit comprises:
a first NMOS transistor connected between the output of the NAND gate and a second node and having a gate connected to a power supply terminal;
a first PMOS transistor connected between the second node and a VPP power supply terminal and having a gate connected to the first node;

a second PMOS transistor connected between the VPP power supply terminal and the first node and having a gate connected to the second node; and a second NMOS transistor connected between the first node and a ground terminal and having a gate connected to the output of the NAND gate.

7. The semiconductor memory device as claimed in claim 5, wherein the output circuit comprises:

a pull-up transistor connected between a VPP power supply terminal and an output terminal, the pull-up transistor being turned on according to the electric potential of the first node; and a pull-down transistor connected between the output terminal and a ground terminal, the pull-down transistor being turned on according to the electric potential of the first node.

8. The semiconductor memory device as claimed in claim 1, wherein the block address decoder comprises:

a decoder for decoding block select addresses;

an output unit for outputting a plurality of block select signals according to an output of the decoder; and a controller for blocking the decoding operation of the decoder according to a given one of the block addresses and a test mode signal, and activating the block select signals by classifying the block select signals into an even number and an odd number.

9. The semiconductor memory device as claimed in claim 8, wherein the decoder comprises:

first to third inverters for inverting first to third block select addresses, respectively; and a group of first NAND gates for combining the first to third block select addresses according to an output of the controller, thus outputting decoding signals.

10. The semiconductor memory device as claimed in claim 9, wherein the output unit comprises a group of second NAND gates for outputting the decoding signals by classifying the decoding signals as an even-numbered signal or an odd-numbered signal according to the output of the controller.

11. The semiconductor memory device as claimed in claim 8, wherein the controller comprises:

a first NAND gate for combining one of the block select addresses and a test mode signal;

an inverter for inverting the test mode signal and blocking the decoding operation of the decoder according to the inverted signal; and a second NAND gate for controlling the output unit according to an output of the first NAND gate and the test mode signal.

* * * * *